United States Patent [19]
Ariki

[11] Patent Number: 6,052,316
[45] Date of Patent: Apr. 18, 2000

[54] OUTPUT BUFFER CIRCUITRY FOR SEMICONDUCTOR INTEGRATED CIRCUIT DEVICE

[75] Inventor: Takuya Ariki, Hyogo, Japan

[73] Assignee: Mitsubishi Denki Kabushiki Kaisha, Tokyo, Japan

[21] Appl. No.: 09/245,132

[22] Filed: Feb. 4, 1999

Related U.S. Application Data

[63] Continuation of application No. PCT/JP96/02310, Aug. 16, 1996.

[51] Int. Cl.[7] ........................................................ G11C 7/00
[52] U.S. Cl. .................................. 365/189.05; 365/230.06
[58] Field of Search .......................... 365/189.05, 230.06, 365/194

[56] References Cited

U.S. PATENT DOCUMENTS

| | | | |
|---|---|---|---|
| 5,535,171 | 7/1996 | Kim et al. | 365/189.05 |
| 5,694,361 | 12/1997 | Uchida | 365/189.05 |

FOREIGN PATENT DOCUMENTS

| | | |
|---|---|---|
| 1-149518 | 6/1989 | Japan . |
| 4-196617 | 7/1992 | Japan . |
| 5-290582 | 11/1993 | Japan . |
| 5-327444 | 12/1993 | Japan . |
| 6-140909 | 5/1994 | Japan . |
| 8-8717 | 1/1996 | Japan . |

*Primary Examiner*—Vu A. Le
*Attorney, Agent, or Firm*—McDermott, Will & Emery

[57] ABSTRACT

A semiconductor integrated circuit device includes a plurality of data output buffer parts in correspondence to a plurality of data input/output terminals. Each data output buffer part is supplied with a power supply potential and a ground potential by power supply lines and two ground lines connected with independent power supply pads and ground potential supply pads respectively. When outputting a high-level signal, each data output buffer part supplies a current to the corresponding data output terminal from the two power supply lines. Therefore, the value of a current flowing per power supply line can be suppressed for reducing noise caused on the power supply line. Similarly, noise caused on the ground lines can also be reduced.

12 Claims, 11 Drawing Sheets

6,052,316

OUTPUT BUFFER CIRCUITRY FOR SEMICONDUCTOR INTEGRATED CIRCUIT DEVICE

REFERENCE TO RELATED APPLICATION

This Application is a continuation of International Application No. PCT/JP96/02310, whose international filing date is Aug. 16, 1996, the disclosures of which Applications are incorporated by reference herein. The benefit of the filing and priority dates of the International Application is respectfully requested.

BACKGROUND OF THE INVENTION

1. Field of the Invention

The present invention relates to a semiconductor integrated circuit device, and more specifically, it relates to a semiconductor integrated circuit device having a plurality of output buffer circuits, which can output a plurality of data in parallel with each other.

2. Description of the Background Art

Following increase of the storage capacity of a dynamic semiconductor memory device (hereinafter referred to as a DRAM) or a static semiconductor memory device (hereinafter referred to as an SRAM), bit multiplication of a data input/output structure is now under way for increasing the bit width of simultaneously inputted/outputted data. If data are inputted/outputted with a narrow bit width, the flexibility of system design is disadvantageously restricted.

When the memory capacity required by a system and the bit width of inputted/outputted data are constant, the system can be configured with a smaller number of chips as the bit width of data inputted/outputted in/from each chip increases following increase of the storage capacity of the semiconductor memory device per chip.

If a system requires a memory capacity of 4 MB, for example, 32 semiconductor chips in total are necessary for configuring the corresponding memory system with those of a 1 M×1 structure, while only two semiconductor chips are necessary when employing those of a 1 M×16 structure.

When extending a memory system having a large memory capacity per chip, on the other hand, the memory capacity of the extension unit unnecessarily increases if the bit width of inputted/outputted data remains constant.

Consider the case of extending a memory system configured by eight DRAMs of a 256 K×4 structure with four DRAMs of a 4 M×4 structure having a storage capacity of 16 times per chip with a constant bit width of inputted/outputted data. In this case, the capacity of the memory system extended with four DRAMs of the 4 M×4 structure is expanded from 1 MB to 16 MB at a stretch. If DRAMs having a 1 M×16 data input/output structure per chip, for example, can be employed, however, an extension unit for the memory system having a memory capacity of 4 MB can be formed with two chips.

In either case, therefore, the whole system can be miniaturized with a multi-bit structure following increase of the storage capacity per chip.

However, such increase of the bit width of simultaneously outputted data results in the following problem:

FIG. 1 is a schematic block diagram showing the structure of an output buffer circuit 1000 according to first prior art.

The following description is made with reference to a DRAM as a semiconductor integrated circuit device.

Referring to FIG. 1, the conventional output buffer circuit 1000 includes an output preamplifier 1 for amplifying and outputting data read from a memory cell, an output control circuit 2 for controlling the timing for outputting the data, a NAND circuit 3 receiving the output of the output preamplifier 1 and a control signal from the output control circuit 2, an invertor 10 receiving the output of the output preamplifier 1, a NAND circuit 4 receiving an output of the invertor 10 and the control signal from the output control circuit 2, and invertors 11 and 12 receiving outputs from the NAND circuits 3 and 4 respectively.

The output buffer circuit 1000 further includes an N-channel MOS transistor 5 connected between a data output terminal 7 and a power supply line 8 supplying a power supply potential Vcc with its gate potential controlled by the invertor 11, and an N-channel MOS transistor 6 connected between the data output terminal 7 and a ground line 9 supplying a ground potential GND with its gate potential controlled by the invertor 12.

Operations of the output buffer circuit 1000 are now briefly described.

FIG. 2 is a timing chart showing the potentials of the respective parts and time changes of currents during the operations of the output buffer circuit 1000.

In the following description, symbols P, Q, R and S denote output nodes of the output preamplifier, the output control circuit 2, the invertor 11 and the invertor 12 respectively. Further, symbols $V_P$, $V_Q$, $V_R$ and $V_S$ denote the potentials of the output nodes P, Q, R and S respectively, and symbol $V_{OUT}$ denotes the potential of the data output terminal 7.

Referring to FIG. 2, the output potentials $V_R$ and $V_S$ of the invertors 11 and 12 are at low levels during times t0 and t1 when the output potential $V_Q$ of the output control circuit 2 is at a low level, whether the level of the output potential $V_P$ of the preamplifier 1 is high or low. Therefore, both N-channel MOS transistors 5 and 6 are cut off, and the data output terminal 7 enters a high impedance (Hi-Z) state.

When the output potential $V_Q$ of the output control circuit 2 goes high at a time t2, the output potential $V_R$ of the invertor 11 goes high while the output potential Vs of the invertor 12 remains low in response to the output potential $V_P$, which is at a high level.

The N-channel MOS transistor 5 responsively enters a conducting state, and the potential of the data output terminal 7 starts to rise in response to this transition. A current i1 for charging a load connected to the data output terminal 7 flows to the N-channel MOS transistor 5. In response to this, noise appears on the potential level of the power supply line 8 supplying the power supply potential Vcc.

When the output potential $V_Q$ of the output control circuit 2 goes low at a time t3, the N-channel MOS transistor 5 enters a non-conducting state again and the data output terminal 7 returns to the Hi-Z state in response thereto.

Thereafter the potential $V_Q$ goes high at a time t4, and the N-channel MOS transistor 6 in turn enters a conducting state while the potential level of the data output terminal 7 starts to drop in response to the potential $V_P$, which is now at a low level. At this time, a current i2 for discharging the data output terminal 7 and the load connected thereto flows to the N-channel MOS transistor 6 entering the conducting state. Noise is superposed on the potential level $V_{GND}$ of the ground line 9 supplying the ground potential GND, due to this current i2.

When the potential $V_P$ goes high at a time t5 while the output potential $V_Q$ of the output control circuit 2 remains high, the N-channel MOS transistor 6 enters a non-conducting state and the N-channel MOS transistor 5 enters a conducting state in response thereto. The current i1 necessary for charging the data output terminal 7 and the load connected thereto from a low level to a high level flows to the N-channel MOS transistor 5. In other words, the potential of the data output terminal 7 fully swings from a low level to a high level. Therefore, the value of the current i1 is larger than that at the time t2. Thus, noise superposed on the power supply line 8 for supplying the power supply potential Vcc is at a higher level than that appearing after the time t2.

Further, the potential $V_P$ changes from the high level to a low level at a time t6 while the potential $V_Q$ remains high. At this time, the N-channel MOS transistor 5 enters a non-conducting state and the N-channel MOS transistor 6 enters a conducting state, contrarily to the states at the time t5. Thus, the potential of the data output terminal 7 fully swings from the high level to a low level. Therefore, the value of the discharge current i2 flowing through the N-channel MOS transistor 6 is larger than that at the time t4. Thus, noise superposed on the potential $V_{GND}$ after the time t6 is at a higher level than that superposed after the time t4.

The above description has been made on the noise superposed on the potentials Vcc and $V_{GND}$ of the power supply line 8 and the ground line 9 when only the output buffer circuit 1000 corresponding to the data output terminal 7 operates. However, a recent DRAM has a larger number of simultaneously operating output buffer. The power supply line 8 and the ground line 9 supply the power supply potential Vcc and the ground potential $V_{GND}$ to such a plurality of output buffer. When the plurality of output buffer circuits simultaneously operate, therefore, noise superposed on the power supply line 8 and the ground line 9 exerts more serious influence.

Referring to FIG. 2, dotted lines on the potentials Vcc and $V_{GND}$ show coupling noise caused by a capacitance present between the power supply line 8 and the ground line 9. In other words, noise superposed on the power supply line 8 causes noise not only on the potential level of the power supply line 8 but also on that of the ground line 9. This coupling noise may further unstabilize the circuit operations.

FIG. 3 is a schematic block diagram showing the structure of an output buffer circuit 1200 capable of reducing occurrence of noise, which is disclosed in Japanese Patent Laying-Open No. 1-149518 (1989).

The output buffer circuit 1200 according to second prior art is different in structure from the output buffer circuit 1000 according to the first prior art mainly in the following points:

First, the output buffer circuit 1200 includes two N-channel MOS transistors 27 and 28 as transistors for discharging a data output terminal 25 and a load connected thereto.

Second, a signal for controlling the gate potential of the N-channel MOS transistor 28 is delayed by a delay time of a delay circuit 26 as compared with that for controlling the gate potential of the N-channel MOS transistor 27.

While the output buffer circuit 1200 according to the second prior art is further different from the output buffer circuit 1000 according to the first prior art in a point that a P-channel MOS transistor 23 is employed as a transistor for charging the data output terminal 25 and the load connected thereto, this difference is not essential as described later.

In the following description, symbols P, Q and R denote nodes of gates of the P-channel MOS transistor 23, the N-channel MOS transistor 27 and the N-channel MOS transistor 28 respectively, and symbol S denotes a node connected with drains of the N-channel MOS transistors 27 and 28 connected to the data output terminal 25.

Further, symbols i1 and i2 denote currents flowing through the N-channel MOS transistors 27 and 28 respectively when discharging the data output terminal 25 and the load connected thereto.

The output buffer circuit 1200 according to the second prior art includes the two discharge transistors 27 and 28 entering conducting states with time difference, thereby reducing the peak value of the current flowing into the ground and enabling reduction of noise caused on a ground line.

Operations of the output buffer circuit 1200 according to the second prior art are now briefly described.

FIG. 4 is a timing chart illustrating the operations of the output buffer circuit 1200 according to the second prior art.

First, it is assumed that the potential $V_P$ of the node P is at a low level and the potential $V_Q$ of the node Q is also at a low level at a time t0. Therefore, the potential $V_R$ of the node R is also at a low level. In other words, both N-channel MOS transistors 27 and 28 are in non-conducting states and the P-channel MOS transistor 23 is in a conducting state at the time t0. Therefore, the potential $V_S$ of the node S is at a high level and the data output terminal 25 outputs a high-level signal.

At a time t1, both potentials $V_P$ and $V_Q$ go high in response to read data from a memory cell outputted from a sense amplifier 30. The P-channel MOS transistor 23 enters a non-conducting state and the N-channel MOS transistor 27 enters a conducting state in response to this change. Therefore, the discharge current i1 from the data output terminal 25 and the load connected thereto starts to flow to the N-channel MOS transistor 27. However, the N-channel MOS transistor 28 still remains in the non-conducting state at this point of time.

At a time t2 delayed by the delay time of the delay circuit 26 from the time t1, the potential $V_R$ goes high. In response to this, the N-channel MOS transistor 28 also enters a conducting state and the discharge current i2 starts to flow to the N-channel MOS transistor 28.

Therefore, the currents i1 and i2 flow in temporal dispersion, and hence the peak value of the total discharge current i1+i2 and steepness of a time change thereof are suppressed as compared with the case of feeding a discharge current only through the N-channel MOS transistor 27.

Referring to FIG. 4, dotted lines show the time change of the potential $V_S$ and that of the total discharge current i1+i2 in the case of discharging the data output terminal 25 and the load connected thereto only with the N-channel MOS transistor 27.

Thus, the output buffer circuit 1200 according to the second prior art can reduce the peak value of a discharge current flowing through each data output terminal or relax inclination of a time change thereof, for reducing noise caused on the ground line itself, coupling noise caused between the ground line and the power supply line, and the like.

When the number of simultaneously operating output buffer increases as described above, however, the delay circuit 26 must have a larger delay time for sufficiently reducing the aforementioned noise through the structure of the output buffer circuit 1200 according to the second prior art. In this case, however, the time required for outputting data, i.e., the access time of the semiconductor memory device is deteriorated.

In other words, reduction of the noise is restricted in the structure of the output buffer circuit 1200 according to the second prior art, due to a tradeoff between reduction of the noise and that of the access time.

SUMMARY OF THE INVENTION

An object of the present invention is to provide a semiconductor integrated circuit device which can reduce the peak value of a charge/discharge current also when having a plurality of simultaneously operating output buffer circuits.

Another object of the present invention is to provide a semiconductor integrated circuit device which can reduce noise caused by a charge/discharge current of an output buffer for performing a stable operation.

Briefly stated, the present invention is directed to a semiconductor integrated circuit device including a first plurality of power supply terminals, the first plurality of power supply lines, a second plurality of data output terminals and the second plurality of data output buffers. The first plurality of power supply terminals are supplied with a power supply potential corresponding to the level of outputted data. The first plurality of power supply lines are supplied with the power supply potential from the power supply terminals respectively. The second plurality of data output terminals output data. The second plurality of data output buffers are provided in correspondence to the data output terminals respectively and supplied with data from an internal circuit for driving the potentials of the corresponding data output terminals. Each of the data output buffers includes a third plurality of switching circuits connected between the corresponding data output terminal and any of the first power supply lines respectively and a control circuit for bringing the third plurality of switching circuits into conducting states in response to the data from the internal circuit.

A semiconductor integrated circuit device according to another aspect of the present invention includes a first plurality of first power supply terminals, the first plurality of first power supply lines, the first plurality of second power supply terminals, the first plurality of second power supply lines, a second plurality of data output terminals and the second plurality of data output buffers. The first plurality of first power supply terminals are supplied with a first power supply potential corresponding to a first level of data transferred between the semiconductor integrated circuit device and an external device. The first power supply lines are supplied with the first power supply potential from the first power supply terminals respectively. The first plurality of second power supply terminals are supplied with a second power supply potential corresponding to a second level of the data. The first plurality of second power supply lines are supplied with the second power supply potential from the second power supply terminals respectively. The second plurality of data output terminals output data. The second plurality of data output buffers are provided in correspondence to the data output terminals respectively, and receive data from an internal circuit for driving the potentials of the corresponding data output terminals. Each of the data output buffers includes a third plurality of first switching circuits connected between the corresponding data output terminal and any of the first power supply lines respectively, a second switching circuit connected between the corresponding data output terminal and the second power supply lines, and a control circuit selectively controlling either a state of rendering the third plurality of first switching circuits conductive or a state of rendering the second switching circuit conductive in response to the data from the internal circuit.

More preferably, the control circuit includes a delay circuit outputting a control signal for instructing the third plurality of first switching circuits to successively enter conducting states at prescribed time intervals.

A semiconductor integrated circuit device according to still another aspect of the present invention includes a first plurality of first power supply terminals, the first plurality of first power supply lines, the first plurality of second power supply terminals, the first plurality of second power supply lines, a second plurality of data output terminals and the second plurality of data output buffers. The first plurality of first power supply terminals are supplied with a first power supply potential corresponding to a first level of data transferred between the semiconductor integrated circuit device and an external device. The first plurality of first power supply lines are supplied with the first power supply potential from the first power supply terminals respectively. The first plurality of second power supply terminals are supplied with a second power supply potential corresponding to a second level of the data. The first plurality of second power supply lines are supplied with the second power supply potential from the second power supply terminals respectively. The second plurality of data output terminals output data. The second plurality of data output buffers are provided in correspondence to the data output terminals respectively and receive data from an internal circuit for driving the potentials of the corresponding data output terminals. Each of the data output buffers includes a third plurality of first switching circuits connected between the corresponding data output terminal and any of the first power supply lines respectively, a fourth plurality of second switching circuits connected between the corresponding data output terminal and any of the second power supply lines, and a control circuit selectively controlling either a state of rendering the third plurality of first switching circuits conductive or a state of rendering the fourth plurality of second switching circuits conductive in response to the data from the internal circuit.

More preferably, the control circuit includes a first delay circuit outputting a first control signal instructing the third plurality of first switching circuits to successively enter conducting states at prescribed time intervals in response to the data from the internal circuit and a second delay circuit outputting a second control signal instructing the fourth plurality of second switching circuits to successively enter conducting states at prescribed time intervals.

Accordingly, a principal advantage of the present invention resides in that the peak value of a current flowing through each power supply line can be reduced since a current for charging/discharging the second plurality of data output terminals dividedly flows through the first plurality of power supply terminals and the first plurality of power supply lines.

Another advantage of the present invention resides in that coupling noise caused between the first and second power supply lines is reduced to enable stable circuit operations due to the presence of the first plurality of second power supply lines as viewed from one of the first power supply lines.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

[First Embodiment]

While an output buffer circuit according to the present invention is generally applicable to a semiconductor integrated circuit device, the following description is made particularly with reference to a dynamic semiconductor memory device.

Figure 1:
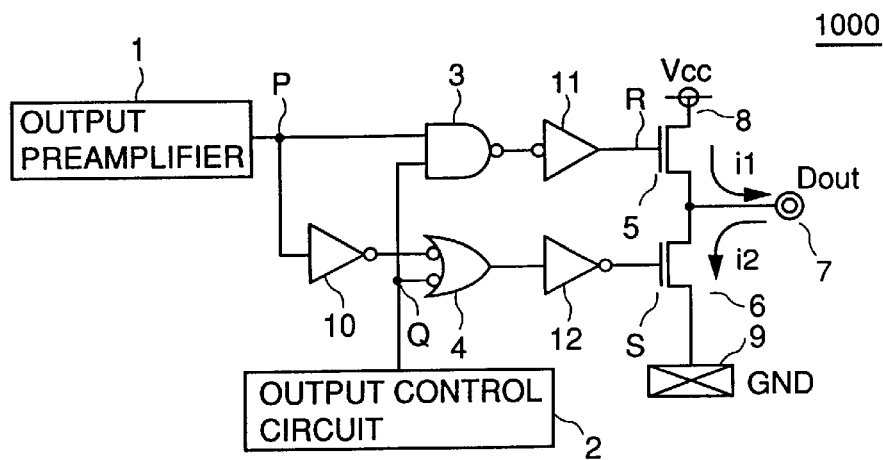
FIG. 1 is a schematic block diagram showing the structure of an output buffer circuit 1000 according to first prior art.
Figure 2:
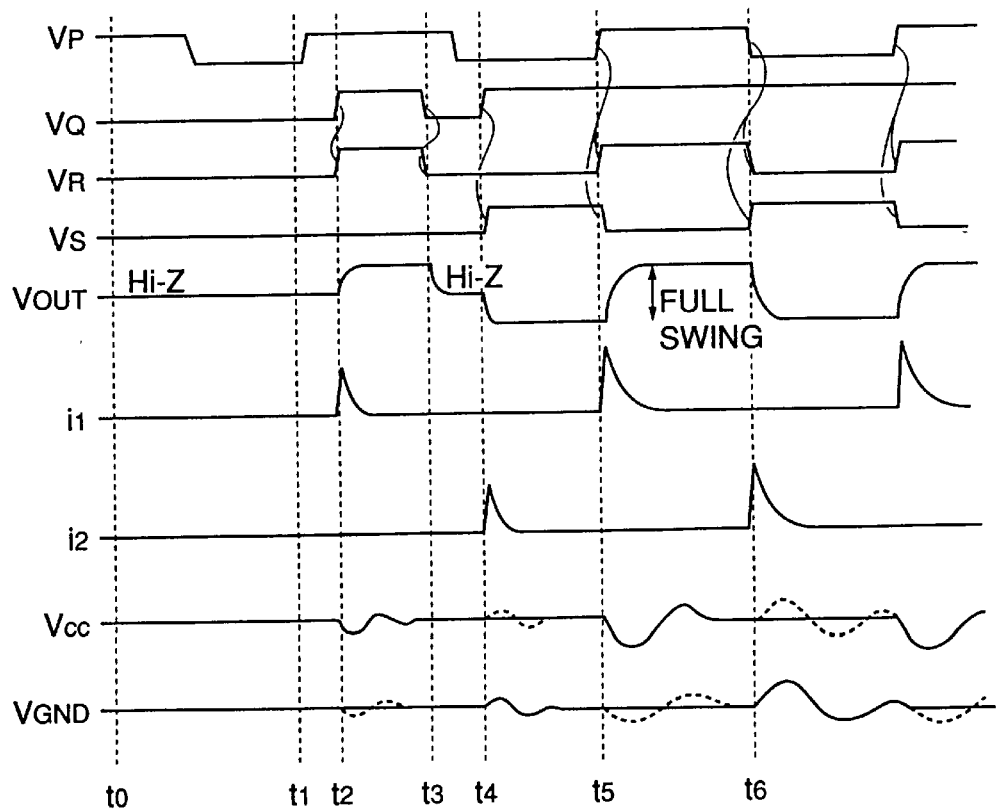
FIG. 2 is a timing chart illustrating operations of the output buffer circuit 1000.
Figure 3:
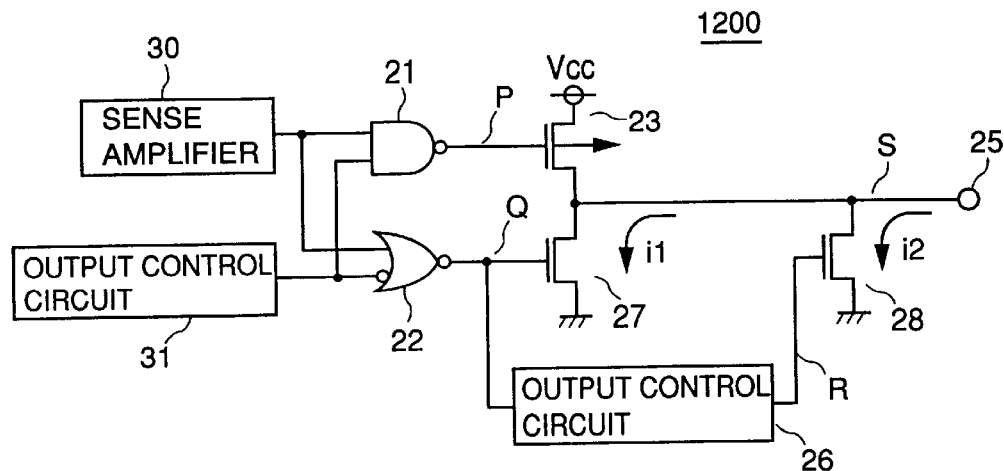
FIG. 3 is a schematic block diagram showing the structure of an output buffer circuit 1200 according to second prior art.
Figure 4:
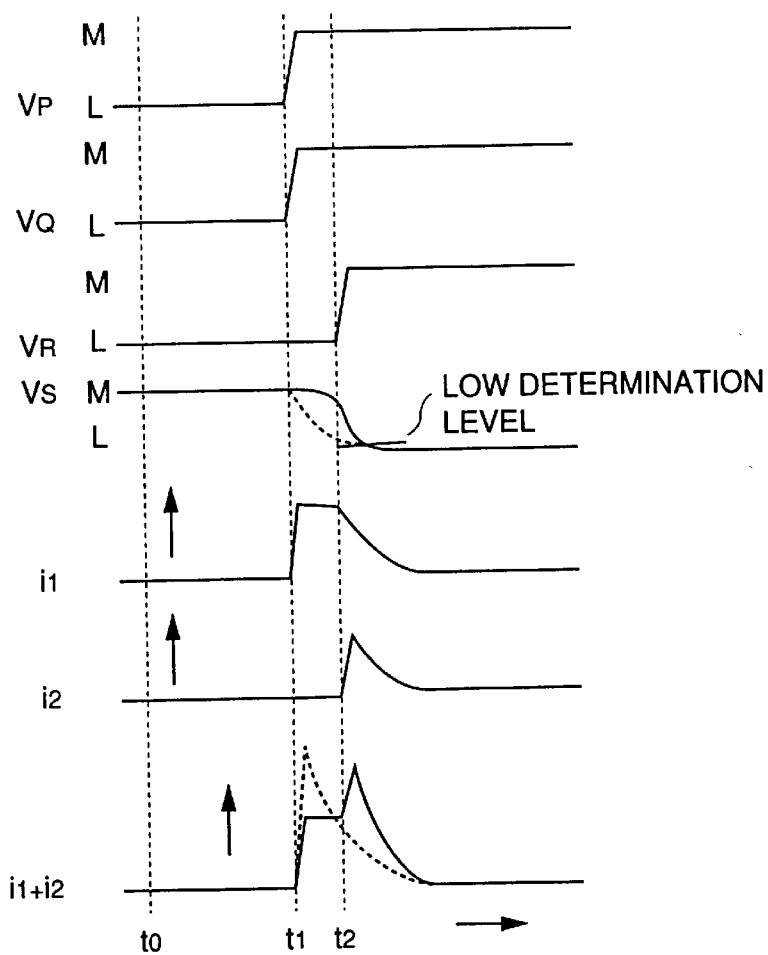
FIG. 4 is a timing chart illustrating operations of the output buffer circuit 1200.
Figure 5:
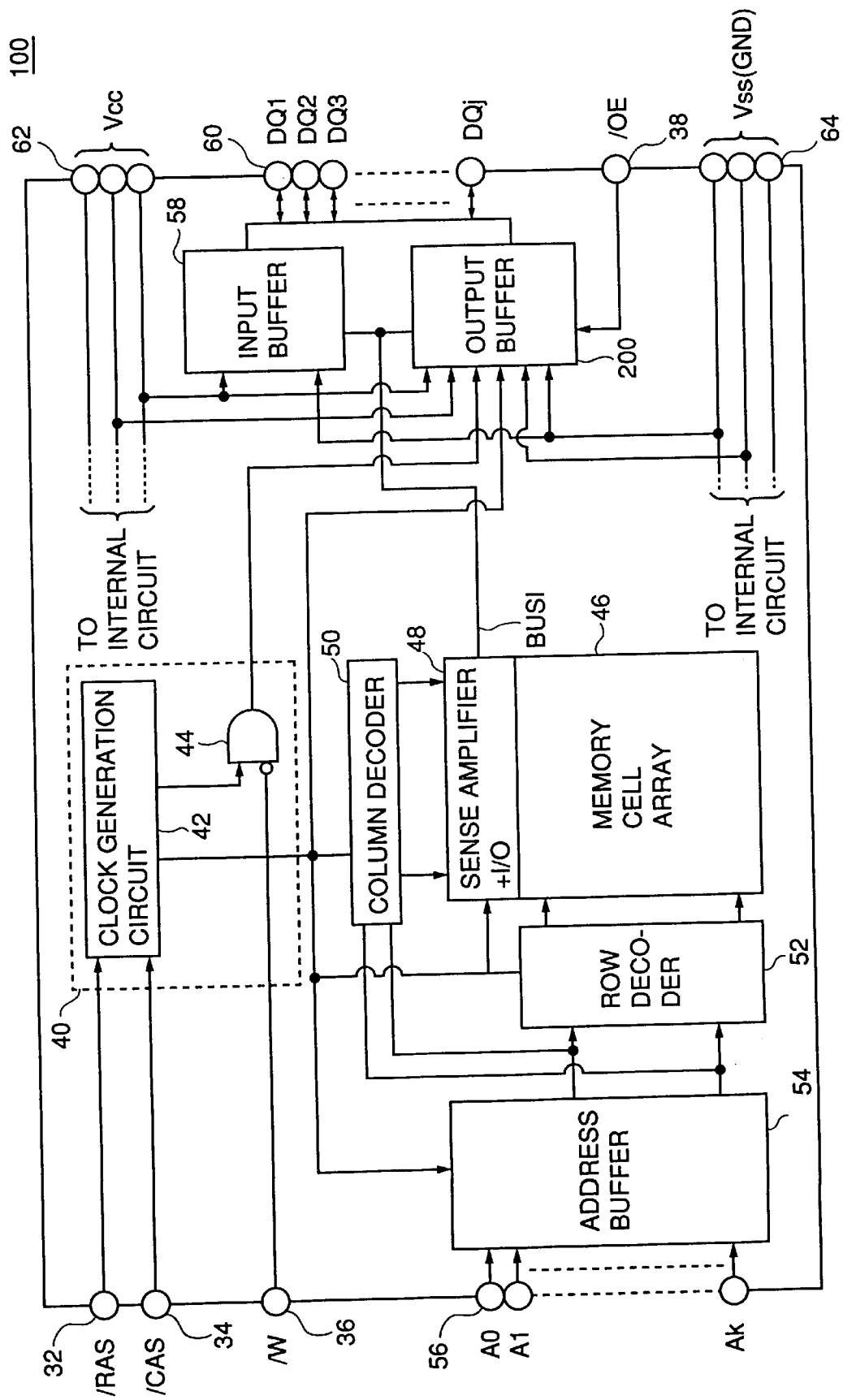
FIG. 5 is a schematic block diagram showing the structure of a semiconductor memory device 100 according to a first embodiment of the present invention.

Referring to FIG. 5, a dynamic semiconductor memory device 100 according to a first embodiment of the present invention includes a control circuit 40 receiving external control signals /RAS, /CAS and /W supplied through external control signal input terminals 32 to 36 and generating an internal control signal, a memory cell array 46 having memory cells arranged in rows and columns, an address buffer 54 receiving external address signals A0 to Ak supplied through an address signal input terminal 56 and generating an internal row address signal and an internal column address signal under control of the control circuit 40, and a row decoder 52 activated under control of the control circuit 40 for decoding the internal row address signal and selecting a row (word line) of the memory cell array 46.

The control circuit 40 includes a clock generation circuit 42 receiving the signals /RAS and /CAS and outputting an internal clock signal for controlling operations of an internal circuit and a logic gate 44 receiving the internal clock signal and the signal /W and outputting an internal control signal for controlling an output buffer 200.

The signal /W supplied to the external control signal input terminal 36 is a write enable signal specifying data writing.

The signal /RAS supplied to the external control signal input terminal 32 is a row address strobe signal for starting an internal operation in the semiconductor memory device 100 and determining an active period of the internal operation. When the signal /RAS is activated, a circuit such as the row decoder 52 related to the operation of selecting the row of the memory cell array 46 is activated. The signal /CAS supplied to the external control signal input terminal 34 is a column address strobe signal for activating a circuit selecting a column of the memory cell array 46.

The semiconductor memory device 100 further includes a column decoder 50 activated under control of the control circuit 40 for decoding the internal column address signal from the address buffer 54 and generating a column selection signal for selecting a column of the memory cell array 46, a sense amplifier for sensing and amplifying data of a memory cell connected to the selected row of the memory cell array 46, an I/O gate for connecting the selected column of the memory cell array 46 to a data bus BUS1 in response to the column selection signal from the column decoder 50, an input buffer 58 generating internal write data from external write data DQ0 to DQj supplied to data input/output terminals 60 in data writing and transmitting the same to the internal data bus BUS1 under control of the control circuit 40, and the output buffer circuit 200 generating external read data DQ0 to DQj from internal read data read on the internal data bus BUS1 in data reading and outputting the same to the data input/output terminals 60 under control of the control circuit 40. FIG. 5 shows the sense amplifier and the I/O gate in a single block 48. The input buffer 58 is activated when both signals /W and /CAS enter active states of low levels for generating the internal write data.

The output buffer circuit 200 is activated in accordance with activation of an output enable signal /OE supplied to an external control signal input terminal 38.

The semiconductor memory device 100 further includes at least one power supply terminal 62 externally supplied with a power supply potential Vcc and at least one ground terminal 64 externally supplied with a ground potential Vss.

The power supply terminal 62 and the ground terminal 64 directly supply the corresponding potentials Vcc and Vss to the input buffer 58 and the output buffer circuit 200 through lines.

Referring to FIG. 5, three power supply terminals 62 are so provided that two of these power supply terminals 62 supply the power supply potential Vcc to the output buffer, while two of three ground terminals 64 supply the ground potential to the output buffer 200.

However, at least any of the power supply terminals 62 and the ground terminals 64 for supplying the power supply potential Vcc and the ground potential Vss to the output buffer 200 and power supply lines and ground lines transmitting these potentials Vcc and Vss may be present in plural, and the present invention is not restricted to the structure shown in FIG. 5, as described later.

Figure 6:
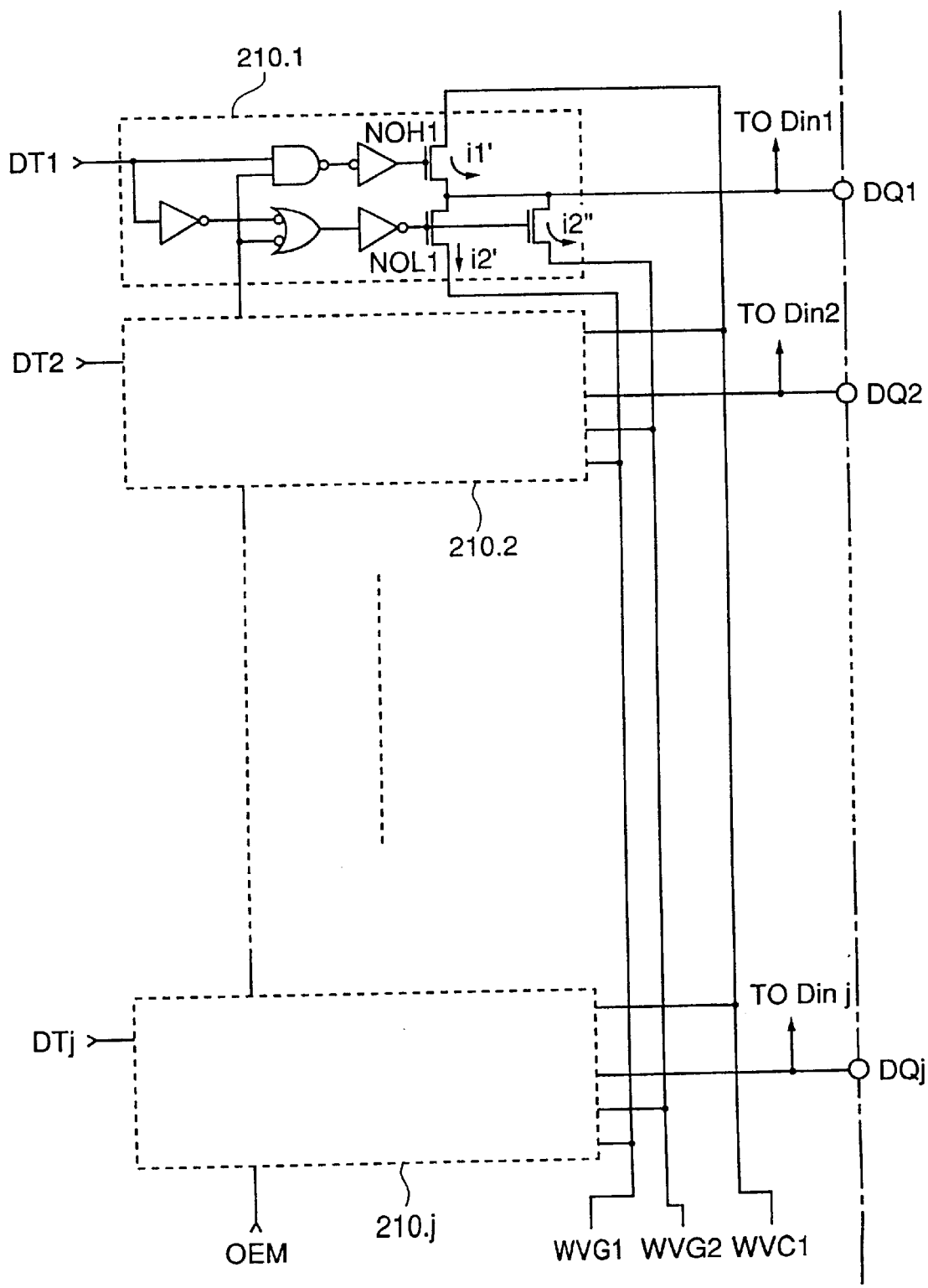
FIG. 6 is a schematic block diagram showing the structure of an output buffer circuit 200 shown in FIG. 5.

FIG. 6 is a schematic block diagram showing the internal structure of the output buffer 200 shown in FIG. 5.

The output buffer circuit 200 includes j output buffer parts 210.1 to 210.j in response to the respective ones of the data input/output terminals 60. The output buffer parts 210.1 to 210.j receive internal read data DT1 to DTj read from the memory cell array 46 and transmitted through the internal data bus BUS1 respectively. In the output buffer circuit 200 according to the first embodiment, the output buffer parts 210.1 to 210.j are supplied with the power supply potential Vcc by a power supply line WVC1 and with the ground potential Vss by two ground lines WVG1 and WVG2. It is assumed that the power supply line WVC1 is connected with the power supply terminals 62 and the ground lines WVG1 and WVG2 are connected with the ground terminals 64 respectively. The output buffer parts 210.1 to 210.j output the external read data DQ1 to DQj to the corresponding data input/output terminals 60 in response to the received internal read data DT1 to DTj respectively.

It is assumed that the output buffer parts 210.1 to 210.j are similar in structure to each other except that the received internal data DT1 to DTj are different from each other.

Figure 7:
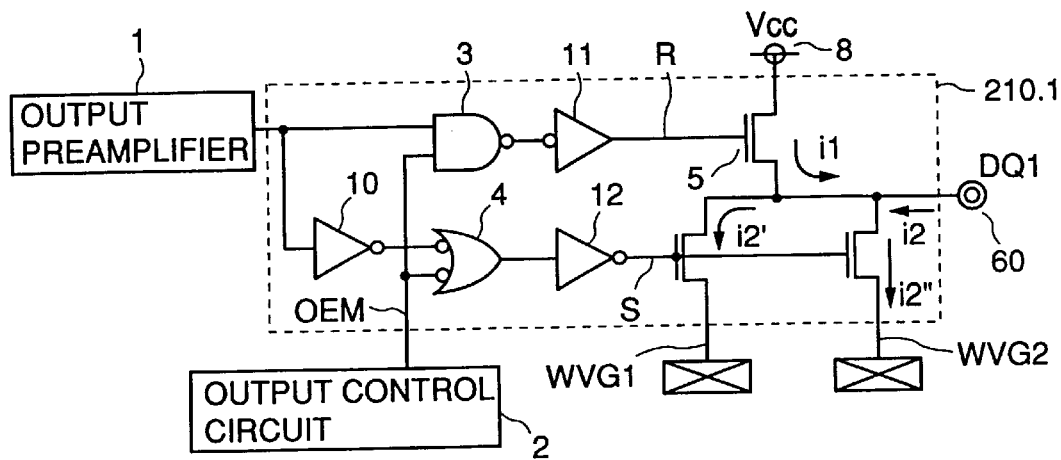
FIG. 7 is a schematic block diagram showing a principal part of the output buffer circuit 200.

FIG. 7 is a schematic block diagram showing the structure of the output buffer part 210.1 among 210.1 to 210.j shown in FIG. 6.

The output buffer part 210.1 includes a NAND circuit 3 receiving a signal OEM from the output control circuit 2 for controlling a data output timing and the signal DT1 outputted from the output preamplifier 1 under control of the control circuit 2, an invertor 10 receiving the signal DT1 and outputting an inverted signal, a NAND circuit 4 receiving the output of the invertor 10 and the signal OEM, an invertor 11 receiving an output of the NAND circuit 3 and outputting an inverted signal, and an invertor 12 receiving an output of the NAND circuit 4 and outputting an inverted signal.

The output buffer part 210.1 further includes an N-channel MOS transistor 5 connected between the data input/output terminal 60 and the power supply line WVC1 with its gate potential controlled by the output of the invertor 11, an N-channel MOS transistor 14 connected between the data input/output terminal 60 and the ground line WVG1 with its gate potential controlled by the output of the invertor 12, and an N-channel MOS transistor 15 connected between the data input/output terminal 60 and the ground line WVG2 with its gate potential controlled by the output of the invertor 12.

The output buffer part 210.1 is different from that of the first prior art in the following points:

First, discharge currents from the data input/output terminal 60 and a load connected thereto flow through the two N-channel MOS transistors 14 and 15.

Second, the discharge currents flowing through the N-channel MOS transistors 14 and 15 independently flow through the ground lines WVG1 and WVG2, to flow out from independent ground terminals respectively.

In the following description, symbol i1 denotes a charge current flowing through the N-channel MOS transistor 5 and symbol i2 denotes a discharge current flowing from the data input/output terminal 60. Further, symbols i2' and i2" denote the discharge currents flowing through the N-channel MOS transistors 14 and 15 respectively. In addition, symbol R denotes a node connected with the gate of the N-channel MOS transistor 5, and symbol S denotes a node connected with the gates of the N-channel MOS transistors 14 and 15.

Figure 8:
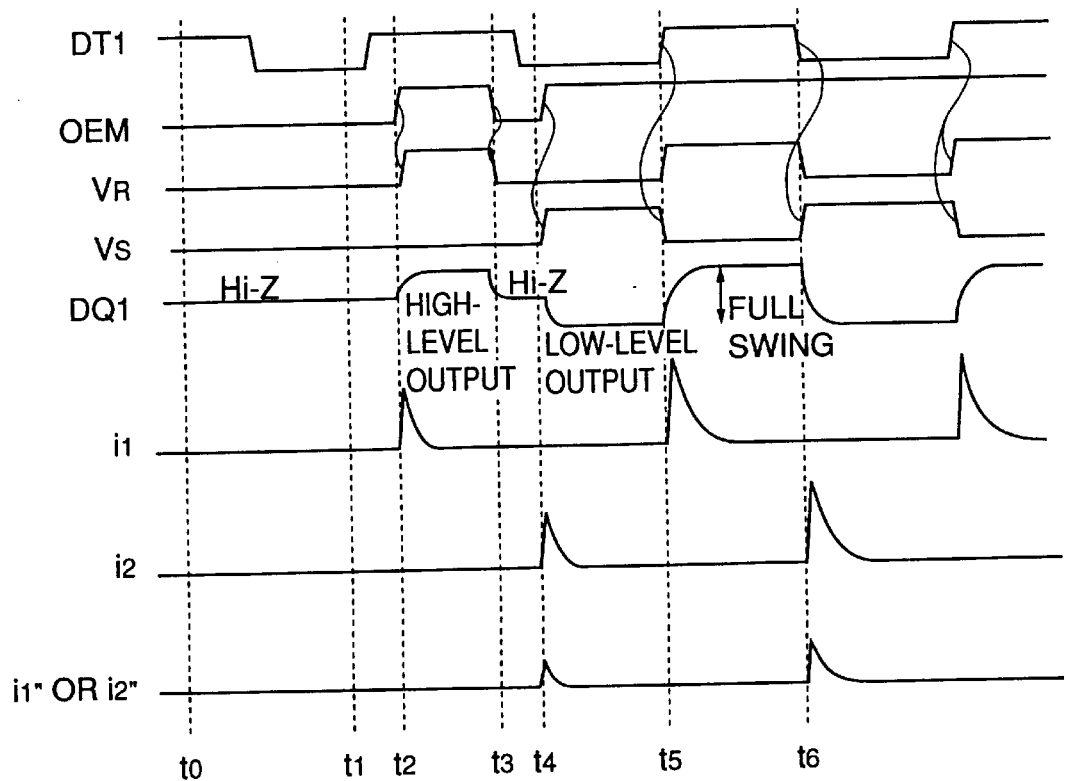
FIG. 8 is a timing chart illustrating operations of the output buffer circuit 200.

FIG. 8 is a timing chart showing operations of the output buffer part 210.1 shown in FIG. 7.

It is assumed that the signal OEM is in an inactive state (low level) at a time t0. While the signal OEM remains low, therefore, both outputs of the invertors 11 and 12 are at low levels and both potentials $V_R$ and $V_S$ of the nodes R and S are also at low levels regardless of the level of the internal read data DT1. In other words, all N-channel MOS transistors 5, 14 and 15 are in non-conducting states, and the data input/output terminal 60 is in a Hi-Z state.

It is assumed that the signal OEM enters an active state (high level) at a time t2, and the internal read data DT1 is at a high level. The potential $V_R$ goes high in response to the activation of the signal OEM at this time. Therefore, the N-channel MOS transistor 5 enters a conducting state and a high-level signal is outputted as the external read data DQ1. In other words, the charge current i1 flowing through the N-channel MOS transistor 5 charges the data input/output terminal 60 and the load connected thereto.

The signal OEM is inactivated and the data input/output terminal 60 enters a Hi-Z state at a time t3, and thereafter the signal OEM goes high again at a time t4. At this time, the potential Vs goes high since the internal read data DT1 is at a low level. Therefore, both N-channel MOS transistors 14 and 15 enter conducting states. In response to this, the discharge current i2 flows into the data input/output terminal 60. However, the discharge current i2 is divided into the currents i2' and i2" in this case, and hence the value of the current flowing through each of the ground lines WVG1 and WVG2 is about half the discharge current i2. Since the ground lines WVG1 and WVG2 are grounded independently of each other, noise caused on the potential of each ground line by the discharge current i2' or i2" is reduced.

When the signal DT1 goes high while the signal OEM remains active at a time t5, the external read data DQ1 fully swings from a low level to a high level in response thereto.

Thereafter the internal read data DT1 further changes from the high level to a low level and the external read data DQ1 fully swings from the high level to a low level at a time t6 while the discharge current i2 flowing into the data input/output terminal 60 is divided into the currents i2' and i2", thereby reducing noise caused on the ground lines WVG1 and WVG2 at the time t6.

The above description has been made on the output buffer part 210.1 included in the output buffer circuit 200.

Also when j output buffer parts 210.1 to 210.j simultaneously operate in practice, noise caused on each ground line can be reduced by providing two ground lines WVG1 and WVG2 similarly to the structure of the output buffer circuit 200.

Consider that j circuit blocks output low-level data. It is assumed that i2'=i2"=i, for simplifying the explanation.

If only a single ground line is provided, a current of 2×i flows per output buffer part. Therefore, a current of j×2×i flows into the ground line in the overall output buffer circuit 200.

When two ground lines are provided, on the other hand, a current of j×i flows to each ground line and the peak current value is reduced as compared with the case provided with only one ground line. Therefore, noise resulting from change of the potentials of the ground lines caused by the current flowing therethrough in discharging can be suppressed.

The ground lines are connected to the whole semiconductor memory circuit device 100 in general, and reduction of noise on the ground lines directly leads to prevention of a malfunction of the semiconductor memory device 100 itself.

When noise is superposed on either ground line due to a large current flowing thereinto, for example, the potential of the ground line shifts to a positive side. Such increase of the ground potential leads to reduction of a gate-to-source voltage of a transistor in an output buffer, for example. This means reduction of drivability of the output transistor, and leads to increase of an access time for data output.

While the above description has been made on the case of dividing the ground line into two systems, the semiconductor memory device can be provided with a larger number of ground lines independently of each other, in order to reduce noise caused on each ground line.

The presence of two ground lines is also effective for reducing coupling noise between the ground lines and the power supply line, as described below.

Figure 9:
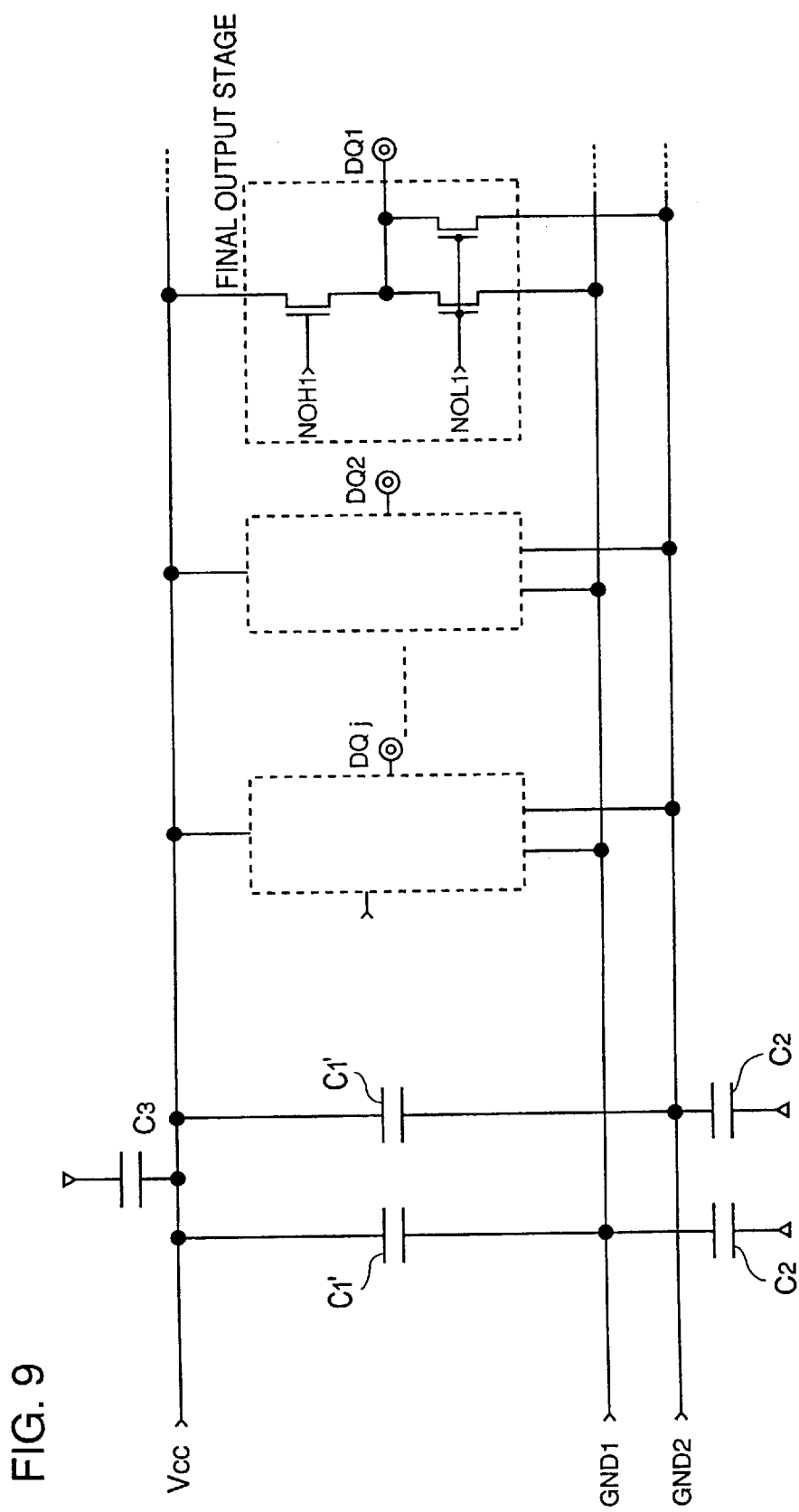
FIG. 9 is a model diagram showing parasitic capacitances of ground lines and a power supply line.

FIG. 9 shows parasitic capacitances present between the power supply line WVC1, the ground lines WVG1 and WVG2, a substrate and other lines.

In general, a capacitor of a constant capacitance is connected between the power supply line WVC1 and the ground line WVG1 so that the potential levels thereof are not readily changed when a charge/discharge current flows. However, this capacitor disadvantageously couples noise on the power supply line WVC1 to the ground line WVG1 as a coupling capacitance therebetween, as described below.

Influence exerted by such coupling noise on the power supply line WVC1 to the ground line WVG1 is now estimated with reference to a simple model.

i) In the case provided with one ground line:

It is assumed that a capacitance C1 is present between the ground line and the power supply line while a capacitance C2 is present between the ground line and the substrate in this case. It is assumed that pulsing change of a value ΔV is caused on the power supply line at this time. Assuming that the substrate potential remains constant with respect to this pulsing change, the value $\Delta V_{GND}$ of noise caused on the ground line is expressed as follows:

$$\Delta V_{GND} = \frac{C_1}{C_1 + C_2} \Delta V \quad (1)$$

ii) In the case provided with two ground lines:

Similar consideration is made on the case provided with the two ground lines WVG1 and WVG2 shown in FIG. 9.

It is assumed that a decoupling capacitance C1' is present between the power supply line WVC1 and the ground line WVG1 or between the power supply line WVC1 and the ground line WVG2. The capacitance C1' is provided for suppressing change of the potential level of the power supply line WVC1 etc. caused by a current flowing therein, and hence a capacitance present between the power supply line WVC1 and the ground may simply be in excess of a prescribed value. When two ground lines WVG1 and WVG2 are provided as shown in FIG. 9, the value of the decoupling capacitance C1' may roughly be so set that C1=2×C1'.

When two ground lines are provided, therefore, change $\Delta V_{GND}$ of the potential level caused on either ground line upon potential change of ΔV on the power supply line is expressed as follows:

$$\Delta V_{GND} = \frac{C_1}{C_1 + 2 \times C_2} \Delta V \quad (2)$$

When two ground lines are provided, therefore, the value of coupling noise can be reduced as compared with the case provided with one ground line.

While the above description has been made with reference to the case provided with one power supply line and two ground lines, a similar effect can be attained with one power supply line and a plurality of ground lines, in more general.

Further, a similar effect is attained on a plurality of power supply lines with one ground line.

[Second Embodiment]

Figure 10:
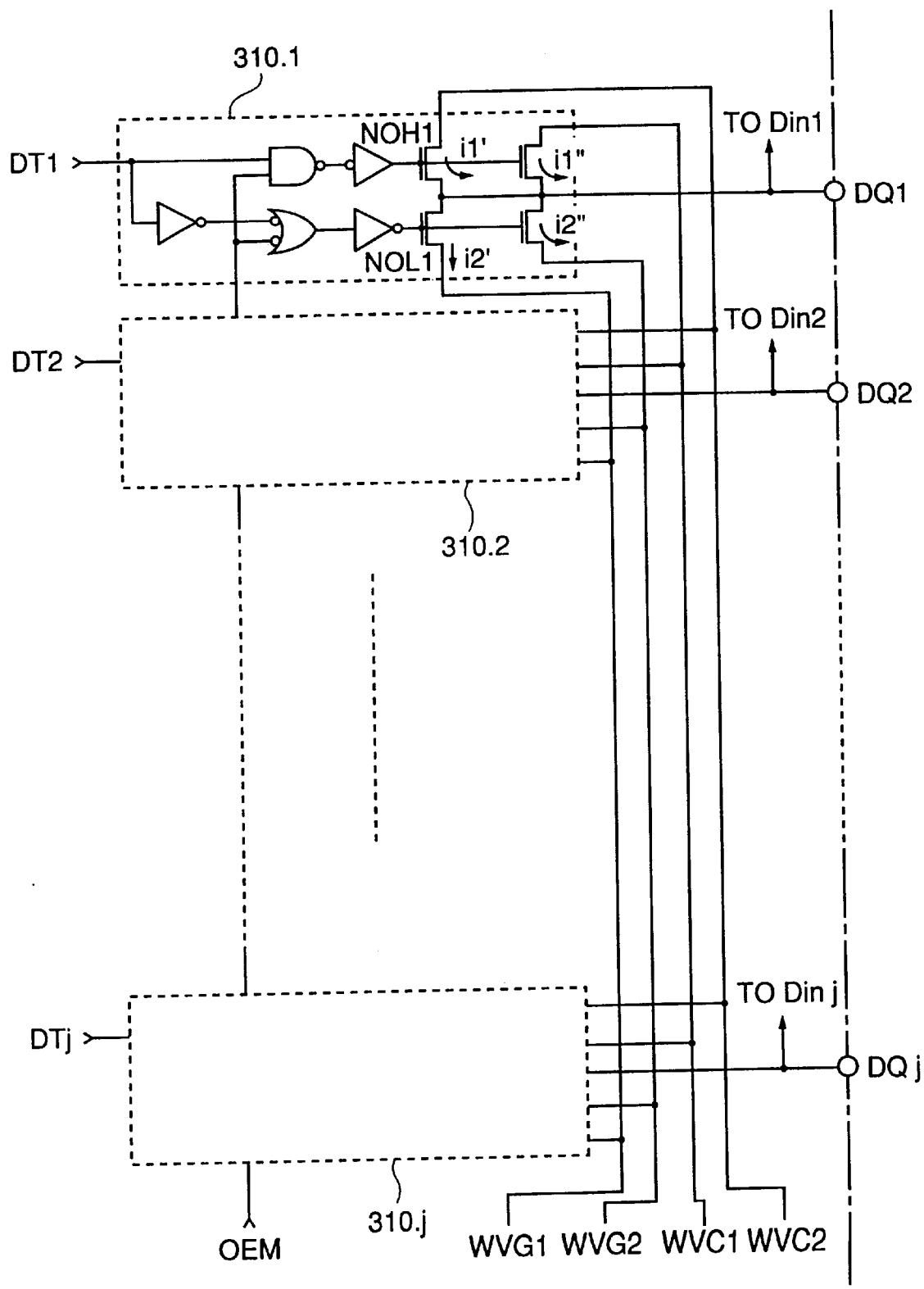
FIG. 10 is a schematic block diagram showing the structure of an output buffer circuit 300 according to a second embodiment of the present invention.

FIG. 10 is a schematic block diagram showing the structure of an output buffer circuit 300 according to a second embodiment of the present invention in contrast with FIG. 6 showing the first embodiment.

The structure of the output buffer circuit 300 according to the second embodiment is different from that of the output buffer circuit 200 according to the first embodiment in the following two points:

First, each of output buffer parts 310.1 to 310.j provided in correspondence to respective data input/output terminals has two transistors supplying a current for charging the corresponding data input/output terminal and a load connected thereto.

These two charge transistors are simultaneously opened/closed in response to the corresponding one of internal read data DT1 to DTj.

Second, these two charge transistors are supplied with a power supply potential from power supply lines WVC1 and WVC2 of separate systems. Further, these two power supply lines WVC1 and WVC2 are supplied with the power supply potential from independent power supply terminals respectively.

Figure 11:
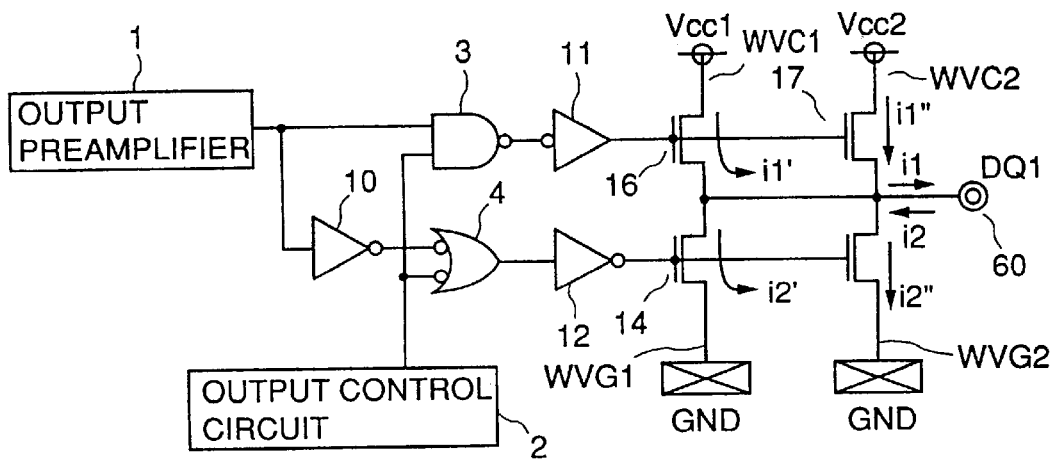
FIG. 11 is a schematic block diagram showing a principal part of the output buffer circuit 300.

FIG. 11 is a schematic block diagram showing the structure of the data output buffer part 310.1 corresponding to one of data input/output terminals 60 in the output buffer circuit 300 shown in FIG. 10 in contrast with FIG. 7.

The structure of the output buffer part 310.1 shown in FIG. 11 is different from that of the output buffer part 210.1 shown in FIG. 7 in a point that an N-channel transistor 16 is connected between the data input/output terminal 60 outputting external read data DQ1 and the first power supply line WVC1 and an N-channel transistor 17 is connected between the data input/output terminal 60 and the second power supply line WVC2. An output of an invertor 11 controls the gate potentials of the N-channel MOS transistors 16 and 17.

The remaining points of this structure are similar to those of the structure of the output buffer part 210.1 according to the first embodiment shown in FIG. 7, and hence parts identical to those in FIG. 7 are denoted by the same reference numerals, to omit redundant description.

In the data output buffer part 310.1 according to the second embodiment, a current i1 for charging the data input/output terminal 60 and the load connected thereto is divided into currents i1' and i1" supplied from the two power supply lines WVC1 and WVC2, which are independent of each other.

Operations of the data output buffer part 310.1 are now briefly described.

Figure 12:
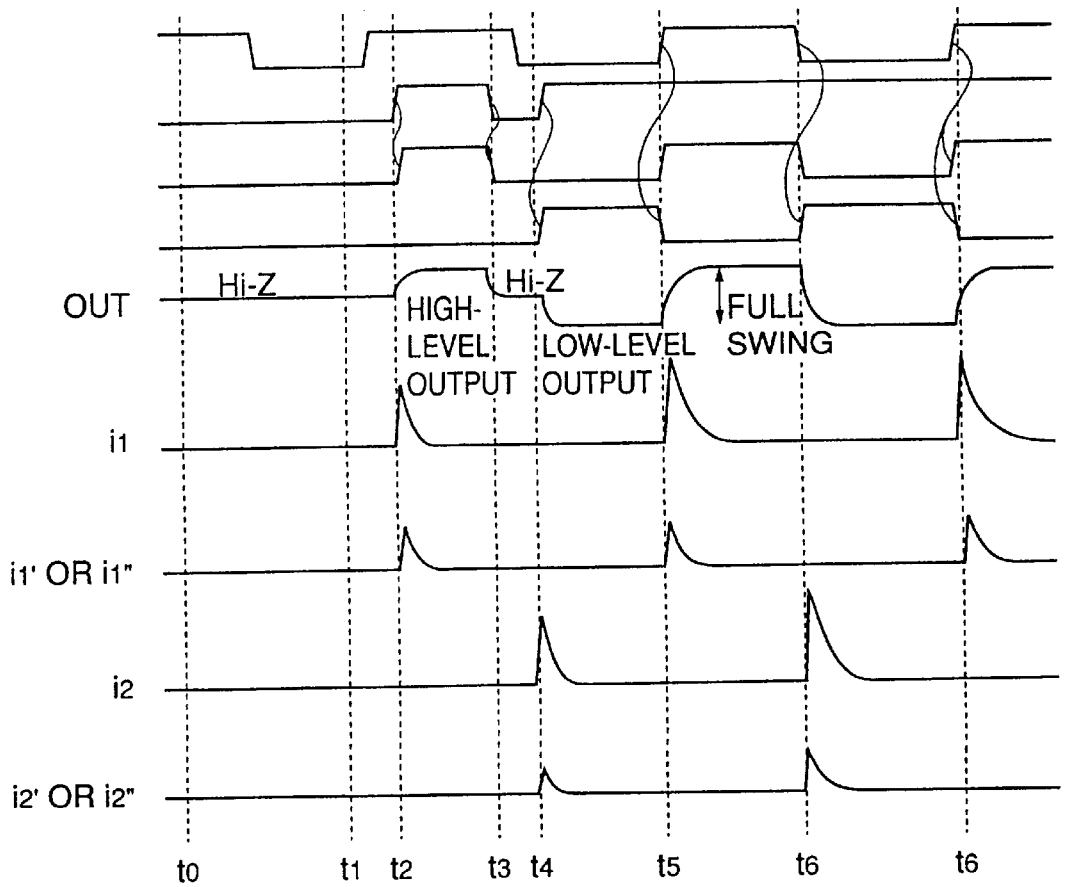
FIG. 12 is a timing chart illustrating operations of the output buffer circuit 300.

FIG. 12 is a timing chart for illustrating the operations of the data output buffer part 310.1 shown in FIG. 11 in contrast with FIG. 8.

An operation of discharging the data input/output terminal 60 and the load connected thereto at a time t4 or t6 is similar to that in the first embodiment described with reference to FIG. 8.

In the data output buffer part 310.1 according to the second embodiment, both N-channel MOS transistors 16 and 17 enter conducting states in response to the internal read data DT1 of a high level when a signal OEM is activated at a time t2. Therefore, the value of the current flowing per charge transistor (either N-channel MOS transistor 16 or 17) is about half that in a data output buffer part provided with one power supply line. Thus, the peak value of the current flowing to the power supply line WVC1 or WVC2 is also substantially halved, whereby noise caused on the power supply line WVC1 or WVC2 is suppressed in response to this current.

Also when the external read data DQ1 fully swings from a low level to a high level at a time t5, the peak value of the charge current flowing to the power supply lines WVC1 and WVC2 is reduced. In other words, the current i1 for one power supply line is divided into two currents i1' and i1", whereby the peak value of the current flowing to the power supply line WVC1 or WVC2 is suppressed to reduce noise caused thereon.

In the data output buffer part 310.1 according to the second embodiment, therefore, the peak current value is reduced not only when the data input/output terminal 60 and the load connected thereto are discharged but also when the same are charged following simultaneous operations of the plurality of data output buffer parts 310.1 to 310.j. Also when the plurality of output buffer parts 310.1 to 310.j simultaneously operate, therefore, noise caused on each of the power supply lines WVC1 and WVC2 and ground lines WVG1 and WVG2 is suppressed.

Further, coupling noise caused on the power supply lines WVC1 and WVC2 by potential change of the ground lines WVG1 and WVG2 is also reduced similarly to the first embodiment in which the coupling noise caused on the ground lines WVG1 and WVG2 caused by potential change of the power supply line WVC1 is reduced.

Thus, circuit operations of a semiconductor integrated circuit are stabilized due to the structure of the output buffer circuit 300 according to the second embodiment.

While the above description has been made with reference to two power supply lines and two ground lines, larger numbers of power supply lines and ground lines can be provided for further noise reduction.

[Third Embodiment]

Figure 13:
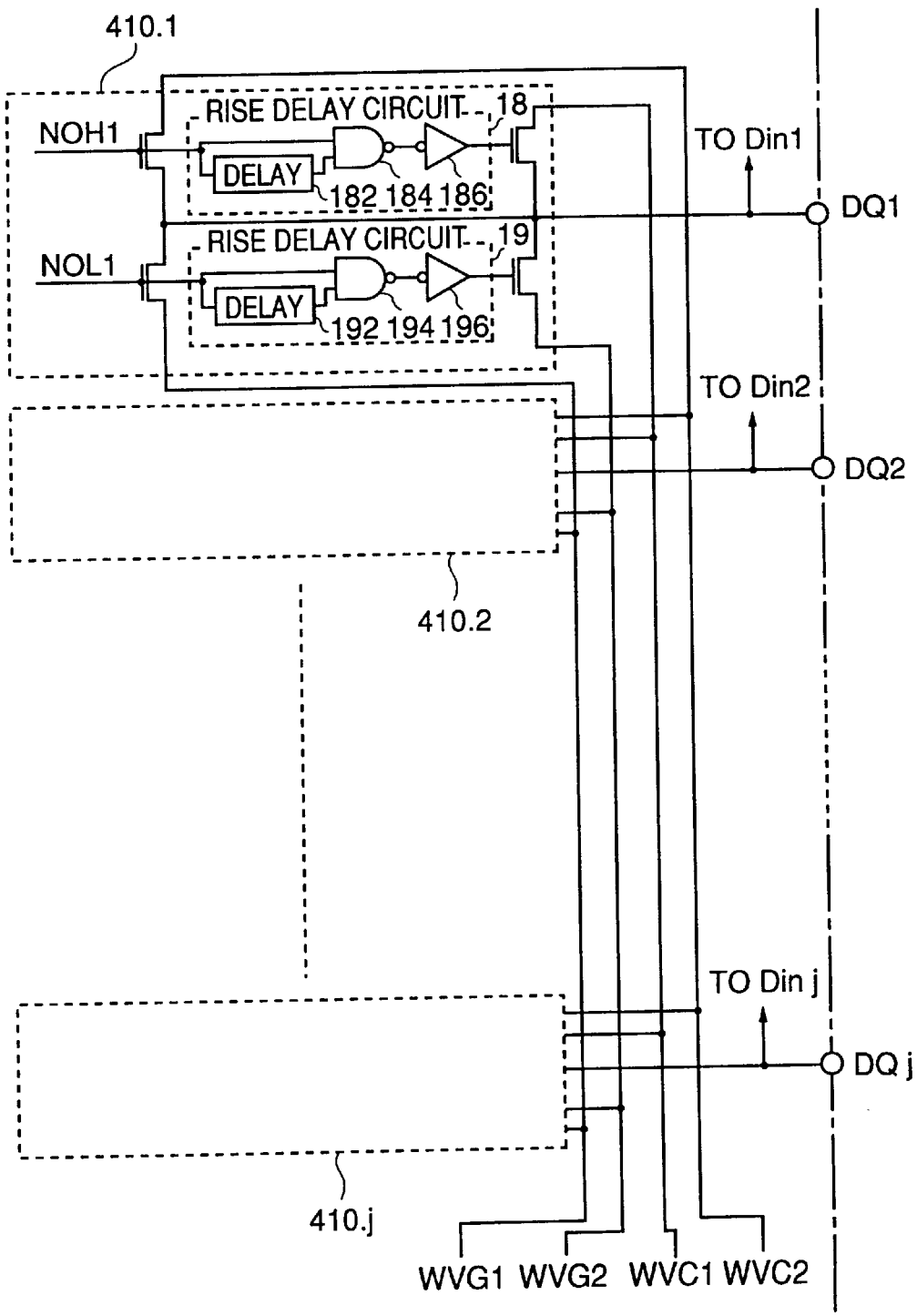
FIG. 13 is a schematic block diagram showing the structure of an output buffer circuit 400 according to a third embodiment of the present invention.

FIG. 13 is a schematic block diagram showing the structure of an output buffer circuit 400 according to a third embodiment of the present invention in contrast with FIG. 10.

The structure of an output buffer part 410.1 according to the third embodiment is different from that of the output buffer part 310.1 according to the second embodiment in the following points:

In the output buffer part 410.1 according to the third embodiment, the gate potential of an N-channel MOS transistor 17, which is a second charge transistor, is driven upon a lapse of a prescribed time after the gate potential of an N-channel MOS transistor 16, which is a first charge transistor, is driven. In the data output buffer part 410.1, further, the gate potential of an N-channel MOS transistor 14, which is a second discharge transistor, is driven upon a lapse of a prescribed time after the gate potential of an N-channel MOS transistor 14, which is a first discharge transistor, is driven.

Figure 14:
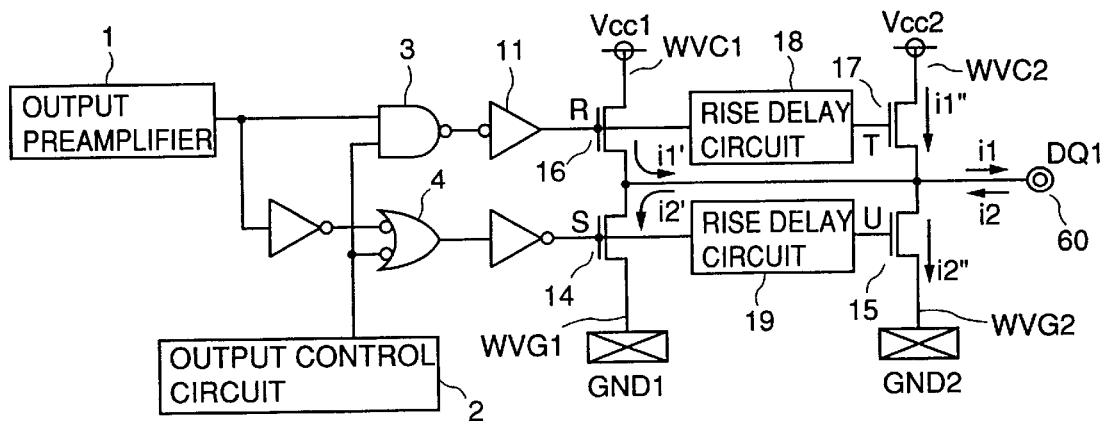
FIG. 14 is a schematic block diagram showing a principal part of the output buffer circuit 400.

FIG. 14 is a schematic block diagram illustrating the structure of the output buffer part 410.1 shown in FIG. 13 in contrast with FIG. 11.

As hereinabove described, the structure of the output buffer part 410.1 according to the third embodiment is different from that of the output buffer part 310.1 according to the second embodiment in the following points:

In addition to the structure of the output buffer part 310.1 according to the second embodiment, the output buffer part 410.1 according to the third embodiment further includes a rise delay circuit 18 between the gates of the N-channel MOS transistor 16 which is the first charge transistor and the N-channel MOS transistor 17 which is the second charge transistor and a rise delay circuit 19 between the gates of the N-channel MOS transistor 14 which is the first discharge transistor and the N-channel MOS transistor 15 which is the second discharge transistor.

The rise delay circuits 18 and 19 are similar in structure to each other.

As shown in FIG. 13, the rise delay circuit 18 includes a delay circuit 182 receiving an output of an invertor 11 in a first input and delaying the same for a prescribed time, a NAND circuit 184 receiving an output of the delay circuit 182 and the output of the invertor 11, and an invertor 186 inverting an output of the NAND circuit 184 and outputting the inverted output to the gate of the N-channel MOS transistor 17.

Operations of the output buffer part 410.1 are now described.

Figure 15:
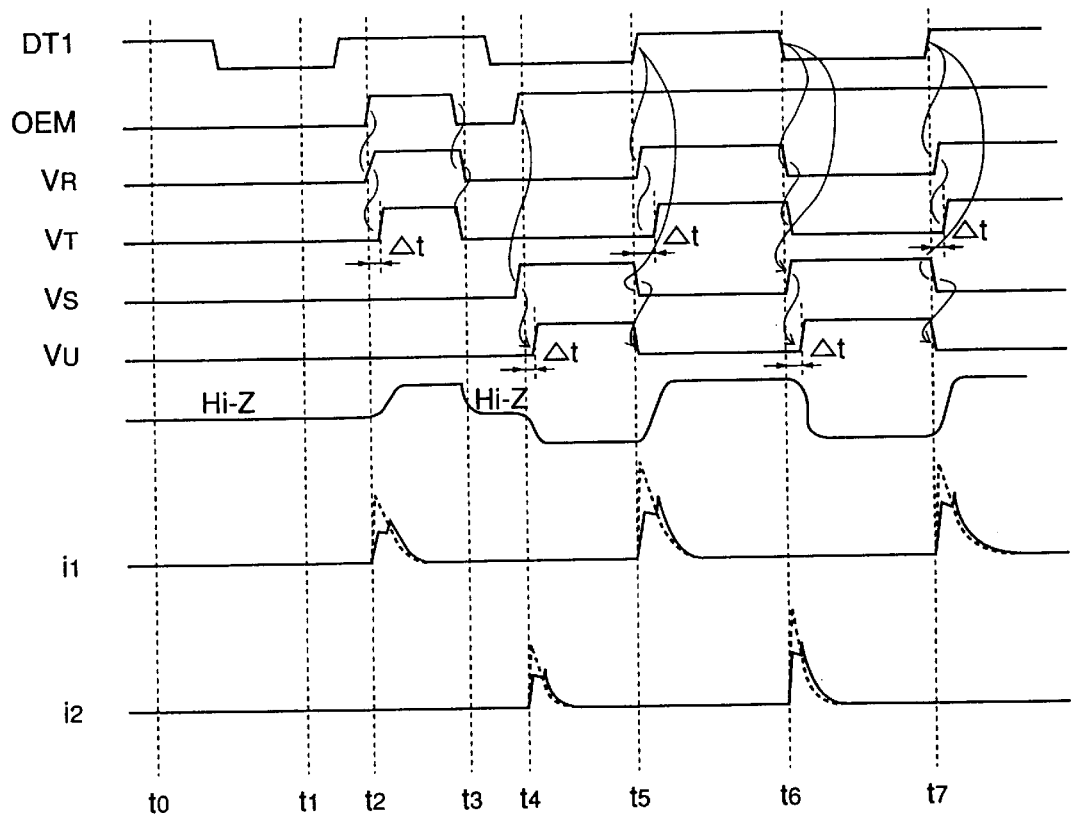
FIG. 15 is a timing chart illustrating operations of the output buffer circuit 400.

FIG. 15 is a timing chart illustrating the operations of the output buffer part 410.1 in contrast with FIG. 12.

In the following description, symbol R denotes a connection node between an output node of the invertor 11 and the gate of the N-channel MOS transistor 16, and symbol S denotes that between an output node of an invertor 12 and the gate of the N-channel MOS transistor 14. Further, symbol T denotes a connection node between an output node of the rise delay circuit 18 and the gate of the N-channel MOS transistor 17, and symbol U denotes a connection node between an output node of the rise delay circuit 19 and the gate of the MOS transistor 15. In addition, symbols $V_R$ to $V_U$ denote the potentials of the nodes R to U respectively.

The operations of the output buffer part 410.1 according to the third embodiment are different from those of the output buffer part 310.1 according to the second embodiment in the following points:

When a signal OEM is activated (high level) at a time t2, for example, the potential $V_R$ goes high in response to internal read data DT1 of a high level. In response to this, the N-channel MOS transistor 16 enters a conducting state and a charge current i1 starts to flow into a data input/output terminal 60.

After a delay by a prescribed delay time Δt specified by the delay circuit 182 from the time t2, the potential $V_H$ goes high. In response to this, the N-channel MOS transistor 17 also enters a conducting state and the charge current i1 starts to flow also through this N-channel MOS transistor 17. In other words, the charge current i1 is expressed by the sum of a current i1' flowing in channel MOS transistor 16 and the N-channel a current i1".

Prescribed time difference is present between the times when the currents i1' and i1" start to flow as described above, and hence the peak current value of the charge current i1 is reduced.

FIG. 15 shows change of the charge current i1 with no rise delay circuit 18 in dotted lines.

When the signal OEM is activated at a time t4, the potential Vs of the node S goes high in response to the internal read data DT1 of a low level. In response to this, the N-channel MOS transistor 14 enters a conducting state and a discharge current i2 starts to flow from the data input/output terminal 60. In a delay by the prescribed delay time Δt from the time t4, further, the potential Vu also goes high and the N-channel MOS transistor 15 also enters a conducting state. After this point of time, therefore, the discharge current i2 flows through the N-channel MOS transistors 14 and 15 and its peak value is suppressed. In addition, the charge currents i1' and i1" are supplied from separate power supply lines WVC1 and WVC2 and discharge currents i2' and i2" are also supplied from separate ground lines WVG1 and WVG2. Therefore, the peak value of the current flowing through each of the power supply lines WVC1 and WVC2 and the ground lines WVG1 and WVG2 is suppressed.

This also applies to the case where external read data DQ1 fully swings from a low level to a high level at a time t5 and to the case where the external read data DQ1 fully swings from the high level to a low level at a time t6.

In the output buffer part 410.1 according to the third embodiment, the currents flow to the power supply lines WVC1 and WVC2 and the ground lines WVG1 and WVG2 independently of each other.

Also when the number of simultaneously operating output buffer parts increases, therefore, specifications required to the delay time Δt of the rise delay circuit 18 are remarkably relaxed as compared with the second prior art.

The third embodiment is effective also in the following case:

Each of the first and second embodiments employs ground lines or power supply lines divided into two or more systems in the chip. Further, power supply terminals or ground terminals supplying the corresponding potential to these lines are absolutely independent of each other. Therefore, the value of the current flowing into or out from each of the ground lines or the power supply lines can be reduced for suppressing noise.

However, even if the chip is provided therein with power supply lines of completely different systems, for example, the lines may be connected to the same lead frame in assembling such as wire bonding.

Figure 16:
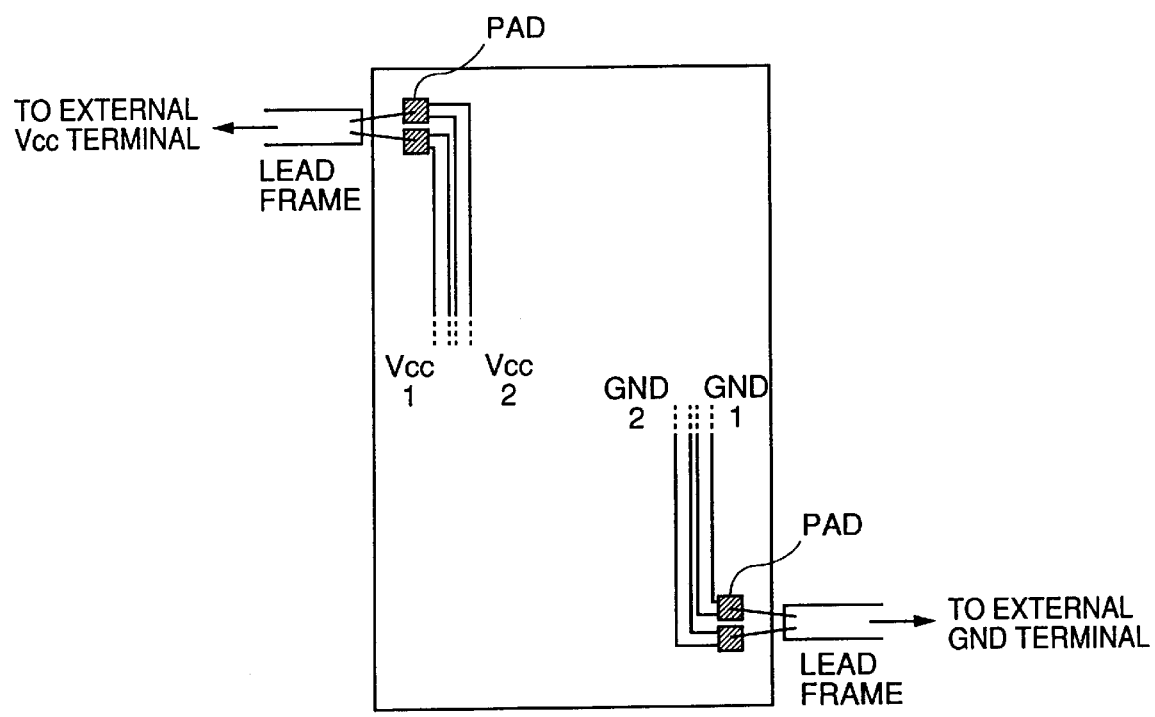
FIG. 16 illustrates the arrangement of power supply pads according to a third embodiment of the present invention.

FIG. 16 illustrates the bonding structure between power supply terminals (pads) or ground terminals (pads) and lead frames.

In this case, the power supply terminals or the ground terminals are connected to a common external lead frame, and hence charge or discharge currents separately flowing in the chip join with each other to flow to the lead frame. In this case, therefore, the noise reduction effect may be reduced as compared with the case of wiring the pads to different lead frames independently of each other.

In the output buffer part 410.1 according to the third embodiment shown in FIG. 14, however, the amount of reduced noise can be optimized also in this case by adjusting the delay time Δt of the rise delay circuit 18.

The aforementioned structure is particularly effective when a package employed for assembling or the like is restricted in structure.

The aforementioned third embodiment is provided with two ground lines and two power supply lines. However, the present invention is not restricted to this structure but also applicable to at least one ground line and a plurality of power supply lines or at least one power supply line and a plurality of ground lines, for example. Further, it is also possible to provide a larger number of power supply lines with a plurality of transistors for supplying a charge current to a data input/output terminal for controlling the transistors to successively enter conducting states at a prescribed delay time.

This also applies to ground lines.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor integrated circuit device comprising:

a first plurality of power supply terminals supplied with a power supply potential corresponding to the level of outputted data;

a plurality of power supply lines, equal in number to that of said first plurality of power supply terminals, supplied with said power supply potential from said first plurality of power supply terminals respectively;

a second plurality of data output terminals for outputting data; and a plurality of data output buffers, equal in number to that of said second plurality of power supply terminals, provided in corresponding to said second plurality of data output terminals respectively for receiving data from an internal circuit and driving the potentials of corresponding said second plurality of output terminals, each said data output buffer including:

a third plurality of switching circuits connected between corresponding said data output terminal and any of said plurality of power supply lines respectively, and a control circuit for bringing said third plurality of switching circuits into conducting stages in response to said data from said internal circuit.

2. A semiconductor integrated circuit device comprising:

a first plurality of first power supply terminals supplied with a first power supply potential corresponding to a first level of data transferred between said device and an external device;

a plurality of first power supply lines, equal in number to that of said first plurality of power supply terminals, supplied with said first power supply potential from said first plurality of power supply terminals respectively;

a plurality of second power supply terminals, equal in number to that of said first plurality of power supply terminals, supplied with a second power supply potential corresponding to a second level of said data;

a plurality of second power supply lines, equal in number to that of said first plurality of power supply terminals, supplied with said second power supply potential from said plurality of second power supply terminals respectively;

a second plurality of data output terminals outputting data; and a plurality of data output buffers, equal in number to that of said second plurality of data output terminals, provided in correspondence to said second plurality of data output terminals respectively for receiving data from an internal circuit and driving the potentials of corresponding said second plurality of data output terminals, each of said plurality of data output buffers including:

a third plurality of first switching circuits connected between corresponding said data output terminal and any of said plurality of first power supply lines respectively, a second switching circuit connected between corresponding said data output terminal and said plurality of second power supply lines, and a control circuit for selectively controlling either a state of rendering said third plurality of first switching circuits conductive or a state of rendering said second switching circuit conductive in response to said internal circuit.

3. The semiconductor integrated circuit device in accordance with claim 2, wherein said control circuit includes:

a delay circuit for outputting a control signal instructing said third plurality of first switching circuits to successively enter conducting states at prescribed time intervals.

4. The semiconductor integrated circuit device in accordance with claim 2, wherein each of said third plurality of first switching circuits is a MOS transistor having a gate potential controlled by a corresponding control signal from said control circuit, and said control circuit includes:

a control signal generation circuit for outputting a gate driving signal responsive to said data from said internal circuit, and a delay circuit for outputting said gate driving signal and signals obtained by successively delaying said gate driving signal at prescribed time intervals to said third plurality of MOS transistors as said corresponding control signals respectively.

5. A semiconductor integrated circuit device comprising:

a first plurality of first power supply terminals supplied with a first power supply potential corresponding to a first level of data transferred between said device and an external device;

a plurality of first power supply lines, equal in number to that of said first plurality of power supply terminals, supplied with said first power supply potential from said first plurality of power supply terminals respectively;

a plurality of second power supply terminals, equal in number to that of said first plurality of power supply terminals, supplied with a second power supply potential corresponding to a second level of said data;

a plurality of second power supply lines, equal in number to that of said first plurality of power supply terminals, supplied with said second power supply potential from said plurality of second power supply terminals respectively;

a second plurality of data output terminals outputting data; and a plurality of data output buffers, equal in number to that of said second plurality of data output terminals, provided in correspondence to said second plurality of data output terminals respectively for receiving data from an internal circuit and driving the potentials of corresponding said second plurality of data output terminals, each of said plurality of data output buffers including:

a third plurality of first switching circuits connected between corresponding said data output terminal and any of said plurality of first power supply lines respectively, a forth plurality of second switching circuit connected between corresponding said data output terminal and said plurality of second power supply lines, and a control circuit for selectively controlling either a state of rendering said third plurality of first switching circuits conductive or a state of rendering said fourth plurality of second switching circuits conductive in response to said internal circuit.

6. The semiconductor integrated circuit device in accordance with claim 5, wherein said control circuit includes:

a first delay circuit for outputting a first control signal instructing said third plurality of first switching circuits to successively enter conducting states at prescribed time intervals in response to said data from said internal circuit, and a second delay circuit for outputting a second control signal instructing said fourth plurality of second switching circuits to successively enter conducting states at prescribed time intervals in response to said data from said internal circuit.

7. The semiconductor integrated circuit device in accordance with claim 5, wherein each of said third plurality of first switching circuits is a first MOS transistor having a gate potential controlled by a corresponding first control signal from said control circuit, each of said fourth plurality of second switching circuits is a second MOS transistor having a gate potential controlled by a corresponding second control signal from said control circuit, and said control circuit includes:

a control signal generation circuit for outputting a gate driving signal responsive to said data from said internal circuit, a first delay circuit for outputting said gate driving signal and signals obtained by successively delaying said gate driving signal at prescribed time intervals to said third plurality of first MOS transistors as said corresponding first control signals respectively, and a second delay circuit for outputting said gate driving signal and signals obtained by successively delaying said gate driving signal at prescribed time intervals to said fourth plurality of second MOS transistors as said corresponding second control signals respectively.

8. A semiconductor integrated circuit device comprising:

a first power supply terminal providing a first power supply potential;

a first power supply line connected to and receiving said first power supply potential from said first power supply terminal;

a first plurality of second power supply terminals providing a second power supply potential;

a plurality of second power supply lines, equal in number to that of said first plurality of power supply terminals, connected to and receiving said second power supply potential from said first power supply terminals respectively;

a second plurality of internal data output terminals connected to and receiving internal output data from an internal circuit;

a plurality of data output buffers, equal in number to that of said second plurality of power supply terminals, connected to and receiving said internal output data from said internal data output terminals respectively, each data output buffer comprising:

a buffer output terminal;

a first switching circuit coupled between said first power supply line and said buffer output terminal;

a plurality of second switching circuits coupled in parallel between said buffer output terminal and said second power supply lines respectively; and a control circuit connected to and selectively controlling said first and second switching circuits in response to said internal output data from said internal data output terminal, wherein said second switching circuits simultaneously provide a plurality of current paths from said buffer output terminal to said second power supply lines respectively when rendered conductive by said control circuit.

9. A semiconductor integrated circuit device comprising:
a first plurality of first power supply terminals providing a first power supply potential;
a plurality of first power supply lines, equal in number to that of said first plurality of power supply terminals, connected to and receiving said first power supply potential form said first plurality of first power supply terminals respectively;
a second plurality of second power supply terminal providing a second power supply potential;
a plurality of second power supply lines, equal in number to that of said second plurality of power supply terminals, connected to and receiving said second power supply potential form said second plurality of second power supply terminals respectively;
a third plurality of internal data output terminals connected to and receiving internal output data from an internal circuit;
a plurality of data output buffers, equal in number to that of said third plurality of internal data output terminals, connected to and receiving said internal output data from said third plurality of internal data output terminals respectively, each data output buffer comprising:
a buffer output terminal;
a plurality of first switching circuits coupled in parallel between said first power supply lines and said buffer output terminal respectively;
a plurality of second switching circuits coupled in parallel between said buffer output terminal and said second power supply lines respectively; and
a control circuit connected to and selectively controlling said first and second switching circuits in response to said internal output data from said internal data output terminal, wherein said second switching circuits provide a plurality of current paths from said buffer output terminal to said plurality of second power supply lines respectively when rendered conductive by said control circuit.

10. The semiconductor integrated circuit device according to claim 9, wherein said data output buffer further comprises a delay circuit connected to and receiving a control signal from said control circuit and coupled between said second switching circuits, wherein said delay circuit successively renders said plurality of second switching circuits at a predetermined time interval in response to said control signal from said control circuit.

11. The semiconductor integrated circuit device according to claim 9, wherein said data output buffer further comprises:
a first delay circuit connected to and receiving a first control signal from said control circuit and coupled between said first switching circuits, wherein said first delay circuit successively renders said plurality of first switching circuits at a predetermined time interval in response to said first control signal from said control circuit; and
a second delay circuit connected to and receiving a second control signal from said control circuit and coupled between said second switching circuits, wherein said second delay circuit successively renders said plurality of second switching circuits at a predetermined time interval in response to said second control signal from said control circuit.

12. The semiconductor integrated circuit device according to claim 11, wherein each of said first and second switching circuits is a MOS transistor having a gate terminal, and said first delay circuit is coupled between said gate terminals of said first switching circuits and said second delay circuit is coupled between said gate terminals of said second switching circuits.

* * * * *